(12) United States Patent
Goto et al.

(10) Patent No.: US 11,412,648 B2
(45) Date of Patent: Aug. 9, 2022

(54) COMPONENT-MOUNTING DEVICE

(71) Applicant: FUJI CORPORATION, Chiryu (JP)

(72) Inventors: Hidenori Goto, Anjo (JP); Ryohei Kamio, Okazaki (JP); Kota Niwa, Okazaki (JP); Kohei Sugihara, Nishio (JP)

(73) Assignee: FUJI CORPORATION, Chiryu (JP)

( * ) Notice: Subject to any disclaimer, the term of this patent is extended or adjusted under 35 U.S.C. 154(b) by 169 days.

(21) Appl. No.: 16/971,082

(22) PCT Filed: Mar. 23, 2018

(86) PCT No.: PCT/JP2018/011854
§ 371 (c)(1),
(2) Date: Aug. 19, 2020

(87) PCT Pub. No.: WO2019/180953
PCT Pub. Date: Sep. 26, 2019

(65) Prior Publication Data
US 2021/0100143 A1 Apr. 1, 2021

(51) Int. Cl.
*B25J 9/16* (2006.01)
*H05K 13/04* (2006.01)
(Continued)

(52) U.S. Cl.
CPC ........ *H05K 13/0413* (2013.01); *B25J 9/1612* (2013.01); *B25J 9/1687* (2013.01);
(Continued)

(58) Field of Classification Search
CPC .......... H05K 13/0413; H05K 13/0408; H05K 13/0812; H05K 13/0813; B25J 9/1612;
(Continued)

(56) References Cited

U.S. PATENT DOCUMENTS 6,314,640 B1 * 11/2001 Yoshida ............. H05K 13/0413
29/832
9,981,382 B1 * 5/2018 Strauss .................. B25J 9/1666
(Continued)

FOREIGN PATENT DOCUMENTS

JP         1-135995 A    5/1989
WO    WO 2017/187527 A1   11/2017

OTHER PUBLICATIONS

International Search Report dated May 15, 2018 in PCT/JP2018/011854 filed on Mar. 23, 2018, 2 pages.

*Primary Examiner* — Robert T Nguyen
*Assistant Examiner* — Dylan M Katz
(74) *Attorney, Agent, or Firm* — Oblon, McClelland, Maier & Neustadt, L.L.P.

(57) ABSTRACT

A component mounting device is capable of mounting a component having a feature portion on an upper surface, on a board. The component mounting device picks up a component by a pickup member and loads the picked-up component on a temporary loading stand at an angle substantially equal to a target mounting angle to the board. Subsequently, the component mounting device images the upper surface of the loaded component by an upper imaging device and picks up again the loaded component. Then, the component mounting device mounts the component picked up again at the target mounting angle at the target mounting position corrected based on the positional deviation amount of the feature portion recognized by the upper surface image of the imaged upper surface.

5 Claims, 11 Drawing Sheets

(51) Int. Cl.
  *H05K 13/08* (2006.01)
  *B25J 13/08* (2006.01)
  *B25J 9/02* (2006.01)
(52) U.S. Cl.
  CPC ............ *B25J 9/1697* (2013.01); *B25J 13/08* (2013.01); *H05K 13/0408* (2013.01); *H05K 13/0812* (2018.08); *B25J 9/026* (2013.01); *H05K 13/0813* (2018.08)
(58) Field of Classification Search
  CPC ........ B25J 9/1687; B25J 9/1697; B25J 13/08; B25J 9/026
  See application file for complete search history.

(56) References Cited

U.S. PATENT DOCUMENTS

2014/0147240 A1* 5/2014 Noda ................... B25J 13/08
                                                   414/751.1
2019/0133010 A1  5/2019 Sakurayama et al.

* cited by examiner

Fig. 9

| | COMPONENT ANGLE | STANDARD NOZZLE NOZZLE ANGLE | SPECIAL NOZZLE NOZZLE ANGLE |
|---|---|---|---|
| PICKUP TIME | R 0° | R 0° | R 0° |
| TEMPORARY LOADING TIME | R 45° | R 45° | R 45° |
| RE-PICKING UP TIME | R 45° | R 0° | R 45° |
| MOUNTING TIME | R 45° | R 0° | R 45° |

Fig. 10

| | COMPONENT ANGLE | NOZZLE ANGLE |
|---|---|---|
| PICKUP TIME | R 0° | R 0° |
| TEMPORARY LOADING TIME | | R 0° |
| RE-PICKING UP TIME | R 0° | R 0° |
| MOUNTING TIME | R 45° | R 45° |

(a) PICKING UP AT NOZZLE ANGLE OF 0°

(b) TEMPORARY LOADING AT NOZZLE ANGLE OF 0°
AND MOUNTING AT 90° (COMPARATIVE EXAMPLE)

(c) TEMPORARY LOADING AT NOZZLE ANGLE OF 90°
AND MOUNTING AT 90° (PRESENT EMBODIMENT)

(a)

(b)

COMPONENT-MOUNTING DEVICE

TECHNICAL FIELD

The present specification discloses a component mounting device.

BACKGROUND ART

Conventionally, there has been proposed a component mounting device which mounts a component, being supplied by a supply stage movable in x and y directions, on a workpiece placed on a mounting stage via a correction stage movable in x, y, and θ directions (for example, see Patent Literature 1). The component mounting device extracts a feature on the component that has been loaded on the correction stage and is imaged with a camera, and aligns the component with the feature in the x, y, and θ directions so that the feature coincides with position where the component is to be mounted on the workpiece on the mounting stage. Thus, the component mounting device can shorten a component mounting time, and improve an alignment accuracy.

PATENT LITERATURE

Patent Literature 1: JP-A-1-135995

BRIEF SUMMARY

Technical Problem

Incidentally, a nozzle, a camera, and a stage (temporary loading stand) of the component mounting device may be inclined with respect to the horizontal due to an attachment error, aging, or the like. When the component is picked up in a state where the nozzle is inclined, the component mounting device picks up the component deviated from the original position thereof. Further, if the component mounting device recognizes a feature portion by imaging the component by the camera in a state where the camera or the temporary loading stand is inclined, the component mounting device recognizes the feature portion which is deviated from the original position. Then, when the component is mounted on a board in a state where the recognition of the feature portion is deviated, the component mounting device mounts the component which is deviated from the original position. Such a mounting deviation of the component appears in a tendency which is different for each pickup angle by the nozzle, causing a large variation in mounting accuracy.

A main purpose of the present disclosure is to suppress a variation in mounting accuracy of a component to a board.

Solution to Problem

The present disclosure has taken the following means to achieve the main object described above.

A component mounting device of the present disclosure is a the component mounting device configured to mount a component, which has a feature portion on an upper surface, on a board, the component mounting device including: a head having a pickup member which picks up the component; a relative moving device configured to relatively move the head; a relative rotation device configured to relatively rotate the pickup member; a temporary loading stand on which the component is capable of being loaded; an upper imaging device imaging the component from above; and a control device configured to control the head, the relative moving device, and the relative rotation device in such a way that the pickup member picks up a component supplied from a component supplying device, control the head, the relative moving device, and the relative rotation device in such a way that the picked-up component is loaded on the temporary loading stand at an angle substantially equal to a target mounting angle to the board, control the upper imaging device in such a way that an upper surface of the loaded component is imaged, control the head, the relative moving device, and the relative rotation device in such a way that the pickup member picks up again the loaded component, and control the head, the relative moving device, and the relative rotation device in such a way that the component picked up again is mounted, at the target mounting angle to the board, at a target mounting position corrected based on a positional deviation amount of the feature portion recognized by an upper surface image of the imaged upper surface.

The component mounting device of the present disclosure loads the component picked up by the pickup member on a temporary loading stand at an angle substantially equal to the target mounting angle to the board. Next, the component mounting device images the upper surface of the loaded component, and picks up again the loaded component by the pickup member. Then, the component mounting device mounts the component picked up again at the target mounting angle at the target mounting position corrected based on the positional deviation amount of the feature portion recognized by the upper surface image of the imaged upper surface. Therefore, since the component can be mounted on the board at an angle substantially equal to the angle when the component is loaded on the temporary loading stand, the pickup member and the upper imaging device, even if an inclination of the temporary loading stand occurs, it is possible to suppress the variation in mounting accuracy.

BRIEF DESCRIPTION OF DRAWINGS

FIG. 9 is an explanatory view for explaining each nozzle angle at a time of picking up, at a time of temporary loading, at a time of re-picking up, and at a time of mounting in the present embodiment.

FIG. 10 is an explanatory view for explaining each nozzle angle at a time of picking up, at a time of temporary loading, at a time of re-picking up, and at a time of mounting in a comparative example.

DESCRIPTION OF EMBODIMENTS

Figure 1:
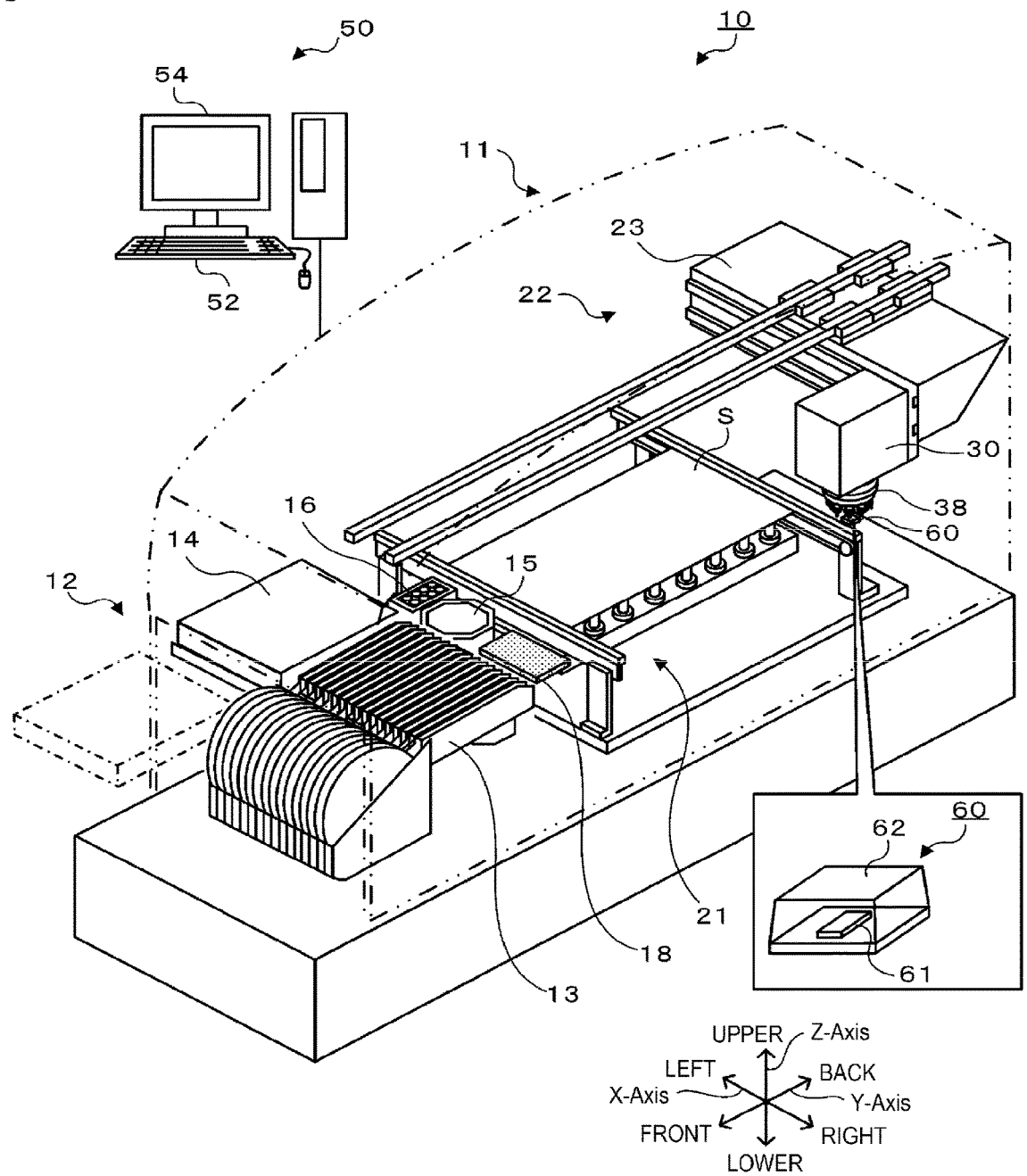
FIG. 1 is an explanatory view illustrating an example of component mounting system 10.
Figure 2:
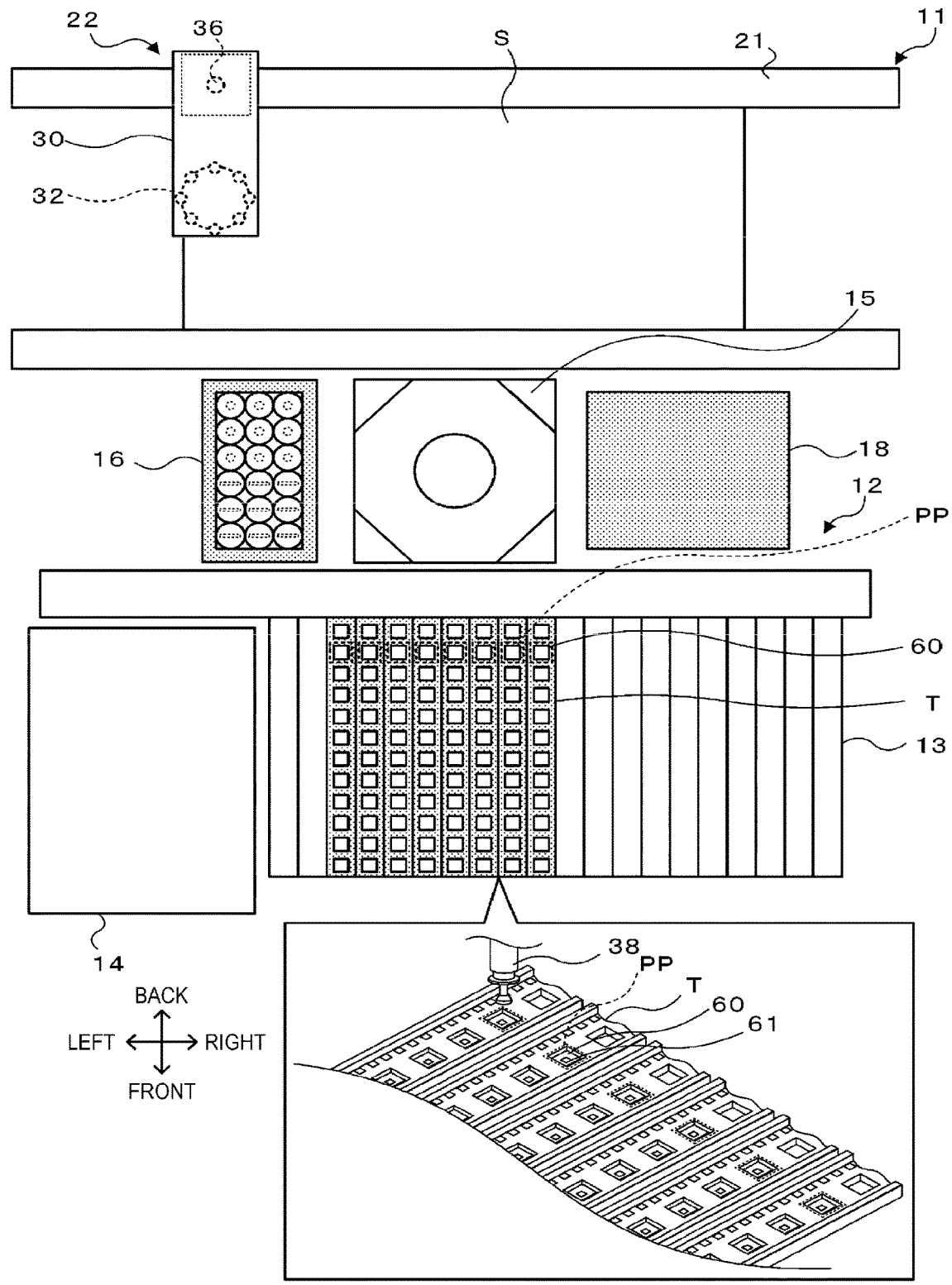
FIG. 2 is a configuration view illustrating an outline of a configuration of component mounting device 11.
Figure 3:
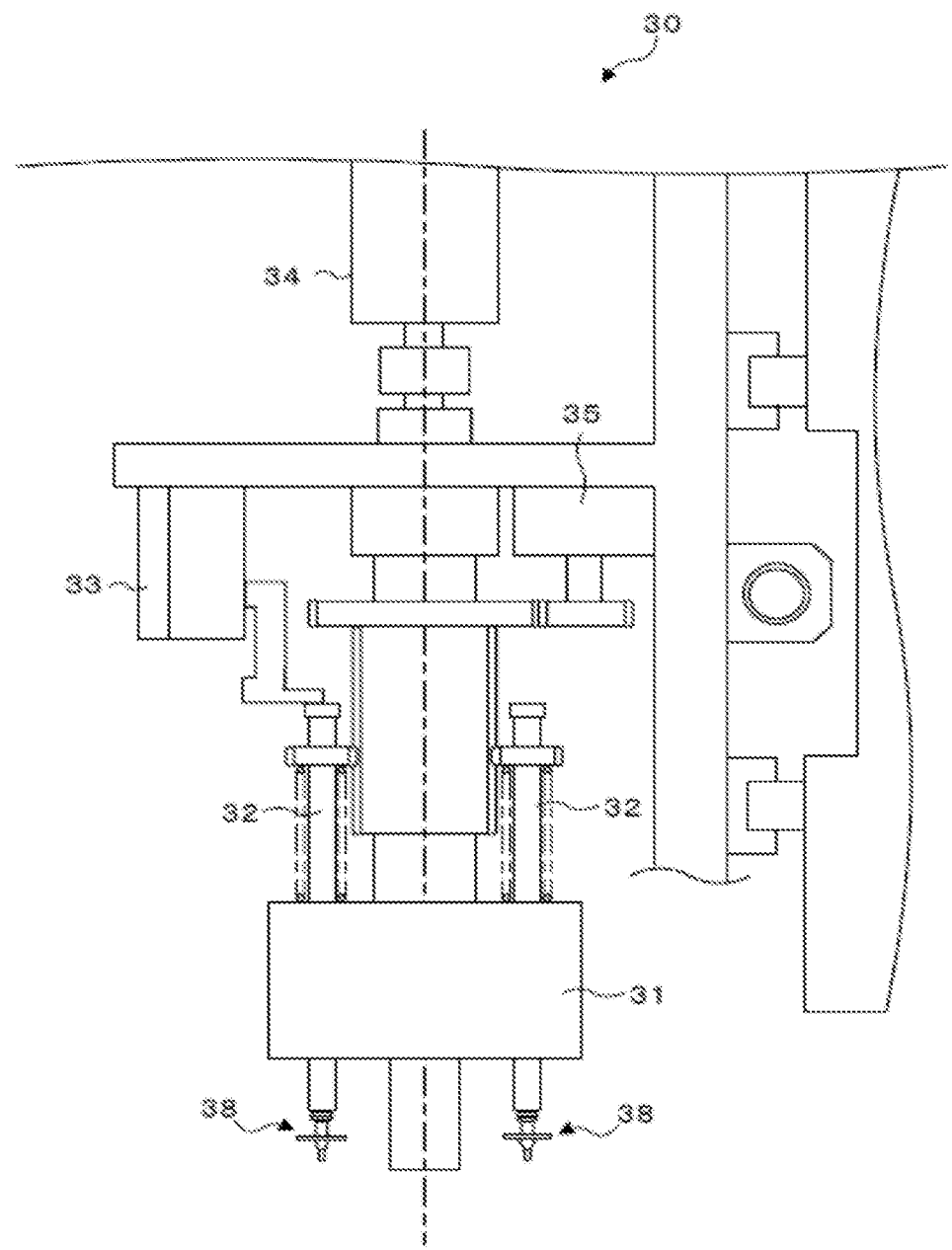
FIG. 3 is a configuration view illustrating an outline of a configuration of mounting head 30.
Figure 4:
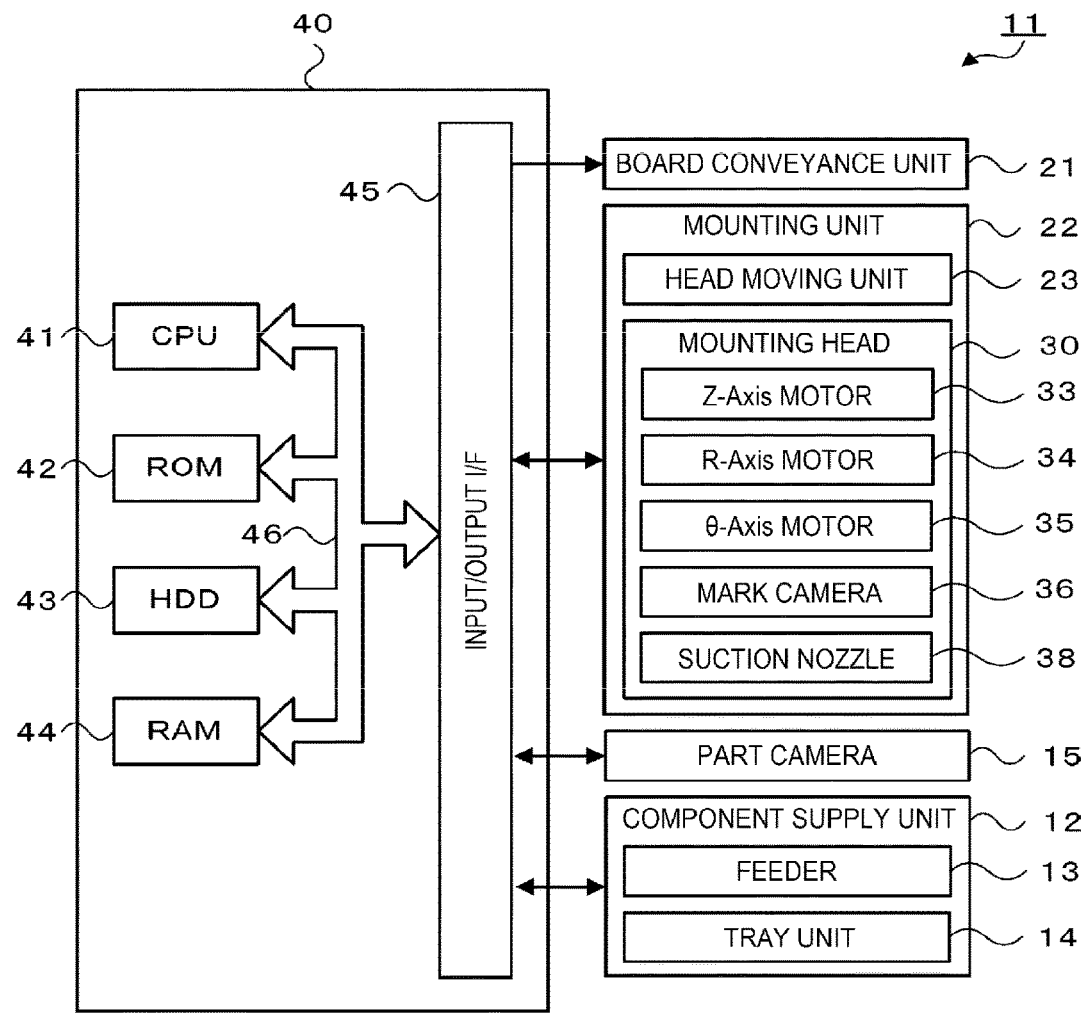
FIG. 4 is a block diagram illustrating an electrical connection relationship of component mounting device 11.

FIG. 1 is an explanatory view illustrating an example of component mounting system 10. FIG. 2 is a configuration view illustrating an outline of a configuration of component mounting device 11. FIG. 3 is a configuration view illustrating an outline of a configuration of mounting head 30. FIG. 4 is a block diagram illustrating an electrical connection relationship of component mounting device 11. Component mounting system 10 is a system that executes a mounting process (install process) related to a process for mounting (installing) a component on board S. Component mounting system 10 includes component mounting device 11 and management computer 50. In component mounting system 10, multiple component mounting devices 11 for mounting components on board S are disposed from upstream to downstream. In FIG. 1, only one component mounting device 11 is illustrated. Incidentally, in FIG. 1, a lateral direction is an X-axis direction, a longitudinal direction is a Y-axis direction, and a vertical direction is a Z-axis direction.

As illustrated in FIGS. 1 to 4, component mounting device 11 includes component supply unit 12, board conveyance unit 21, mounting unit 22, part camera 15, nozzle station 16, loading stand 18, and control device 40.

In component supply unit 12, multiple feeders 13 each having a reel is detachably attached to a front side of component mounting device 11. Tape T is wound around each reel, and multiple components are held on tape T at equal intervals along a longitudinal direction of tape T. Tape T is unwound rearward from the reel, and is sent out to pickup position PP (see FIG. 2) where a component is picked up by suction with suction nozzle 38 in a state where the component is exposed. In addition, component supply unit 12 also includes tray unit 14 having a tray in which multiple components are arranged and loaded.

Board conveyance unit 21 is a unit for performing carrying-in, conveying, fixing at a mounting position, and carrying-out of board S. Board conveyance unit 21 has a pair of conveyor belts which are provided at intervals in the longitudinal direction of FIG. 1 and stretched in the lateral direction. Board S is conveyed by the conveyor belts.

Mounting unit 22 is configured to pick up the component from component supply unit 12 and mount the component on board S fixed to board conveyance unit 21. Mounting unit 22 includes head moving unit 23, mounting head 30, and suction nozzle 38. Head moving unit 23 includes a slider which is guided by a guide rail to move in the XY direction, and a motor for driving the slider. Mounting head 30 is detachably mounted on the slider, and is moved in the XY direction by head moving unit 23. As illustrated in FIG. 3, mounting head 30 includes multiple (for example, 8, 12, or the like) nozzle holders 32 held so as to be aligned in a circumferential direction in cylindrical rotation body 31, Z-axis motor 33, R-axis motor 34, and θ-axis motor 35. On each of multiple nozzle holders 32, each suction nozzle 38 is detachably mounted. Suction nozzle 38 is a pickup member for picking up the component by using a pressure. Z-axis motor 33 moves nozzle holder 32 at a predetermined position (here, forefront of the device) along the Z-axis to adjust a height of suction nozzle 38 mounted on nozzle holder 31. R-axis motor 34 rotates rotation body 31 to revolve (pivot) multiple suction nozzles 38 in the circumferential direction. θ-axis motor 35 rotates (turns) nozzle holder 32 to adjust a rotation angle (hereinafter, referred to as a nozzle angle) of suction nozzle 38.

Figure 5:
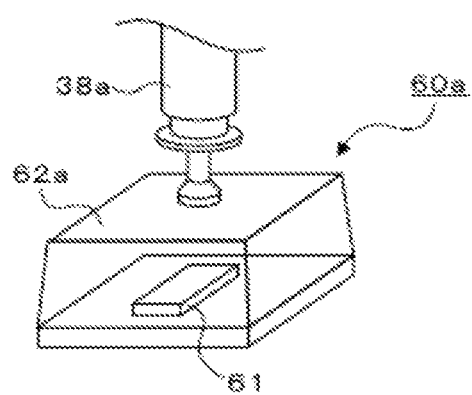
FIG. 5 is an explanatory view illustrating an example of specific component 60.
Figure 5:
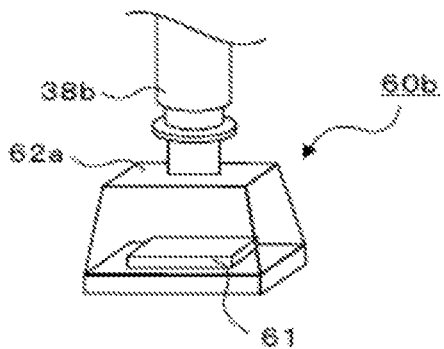

Mounting head 30 can mount not only a general-purpose component of which a shape or the like can be obtained by being imaged from a lower surface side but also, as illustrated in FIG. 1, specific component 60 having feature portion 61 on an upper surface side thereof. Specific component 60 has feature portion 61 of which a position, a shape, or the like is required to be recognized from the upper surface side, and abutting surface 62 which is an upper surface abutting at a time of picking up. Feature portion 61 may be, for example, a light emitting body that emits light. That is, specific component 60 may be an LED component of which an upper portion is formed of a transparent resin having light transmittance. Specific component 60 has various shapes, and as illustrated in FIG. 5, there are a component (hereinafter referred to as standard component 60a) that can be picked up with standard nozzle 38a having a circular suction port, and a component (hereinafter referred to as special component 60b) that can be picked up with special nozzle 38b having a non-circular suction port such as an elongated rectangular shape. Standard nozzle 38a can pick up standard component 60a at any nozzle angle. However, special nozzle 38b can pick up special component 60b only at a nozzle angle determined in advance with respect to the component.

Further, mark camera 36 is disposed in mounting head 30. Mark camera 36 is, for example, a device capable of imaging board S and the component from above. Mark camera 36 is disposed on a lower surface side of mounting head 30 (or slider), and moves in the XY direction together with mounting head 30. Mark camera 36 is configured such that an imaging region thereof is downward, images a reference mark which is attached to board S and used for obtaining the position of board S, and outputs the image to control device 40. Further, mark camera 36 images an upper surface of specific component 60, and outputs the image to control device 40.

Part camera 15 is disposed between board conveyance unit 21 and component supply unit 12. An imaging range of part camera 15 is above part camera 15. When suction nozzle 38, which picks up the component by suction, passes above part camera 15, part camera 15 images the component picked up by suction with suction nozzle 38 from below, and outputs the image to control device 40.

Nozzle station 16 is disposed between board conveyance unit 21 and component supply unit 12, and next to part camera 15. Nozzle station 16 stocks suction nozzles 38 for exchange, and accommodates multiple types of suction nozzles 38 such as standard nozzle 38a and special nozzle 38b described above.

Loading stand 18 is disposed between board conveyance unit 21 and component supply unit 12, and next to part camera 15 (side opposite to nozzle station 16). Loading stand 18 is supported in such a way that the upper surface, on which the component is loaded, is horizontal, and is used as a temporary loading stand of specific component 60 (standard component 60a and special component 60b). When specific component 60 is loaded on loading stand 18, a posture thereof is more likely to be stable than that when it is accommodated in the accommodation section of tape T. Loading stand 18 may be formed to be sized to load the maximum number of specific components 60 to be picked up by suction, on mounting head 30 at a time.

As illustrated in FIG. 4, control device 40 is configured as a microprocessor centered on CPU 41 and includes ROM 42 for storing a processing program, HDD 43 for storing various data, RAM 44 used as a work area, input/output interface 45 for exchanging an electrical signal with an external device, and the like. These are connected to each other via bus 46. Control device 40 outputs control signals to board conveyance unit 21, mounting unit 22 (Z-axis motor 33, R-axis motor 34, θ-axis motor 35, and mark camera 36), component supply unit 12, and part camera 15. Further, control device 40 inputs signals from mounting unit 22 (mark camera 36), component supply unit 12, and part camera 15.

Management computer (PC) 50 is a computer that manages information of each device of component mounting system 10. Management PC 50 includes a control device configured as a CPU-centered microprocessor. The control device includes a ROM for storing a processing program, an HDD for storing various data, a RAM used as a work area, an input/output interface for exchanging an electrical signal with an external device, and the like. Management PC 50 includes input device 52 such as a keyboard or a mouse for an operator to input various commands, and a display 54 for displaying various pieces of information. The HDD stores job information including a production program and other production information. Here, in component mounting device 11, the production program is a program determining which component is mounted on which board S in which order, and how many boards mounted in that way are produced. Further, the production information includes component information configured of a type and a size of the component of a mounting target, a target mounting position (X*, Y*), a target mounting angle θ*, and the like. Management PC 50 is communicatively connected to control device 40 of component mounting device 11 and performs exchange of various pieces of information and control signals.

Figure 6:
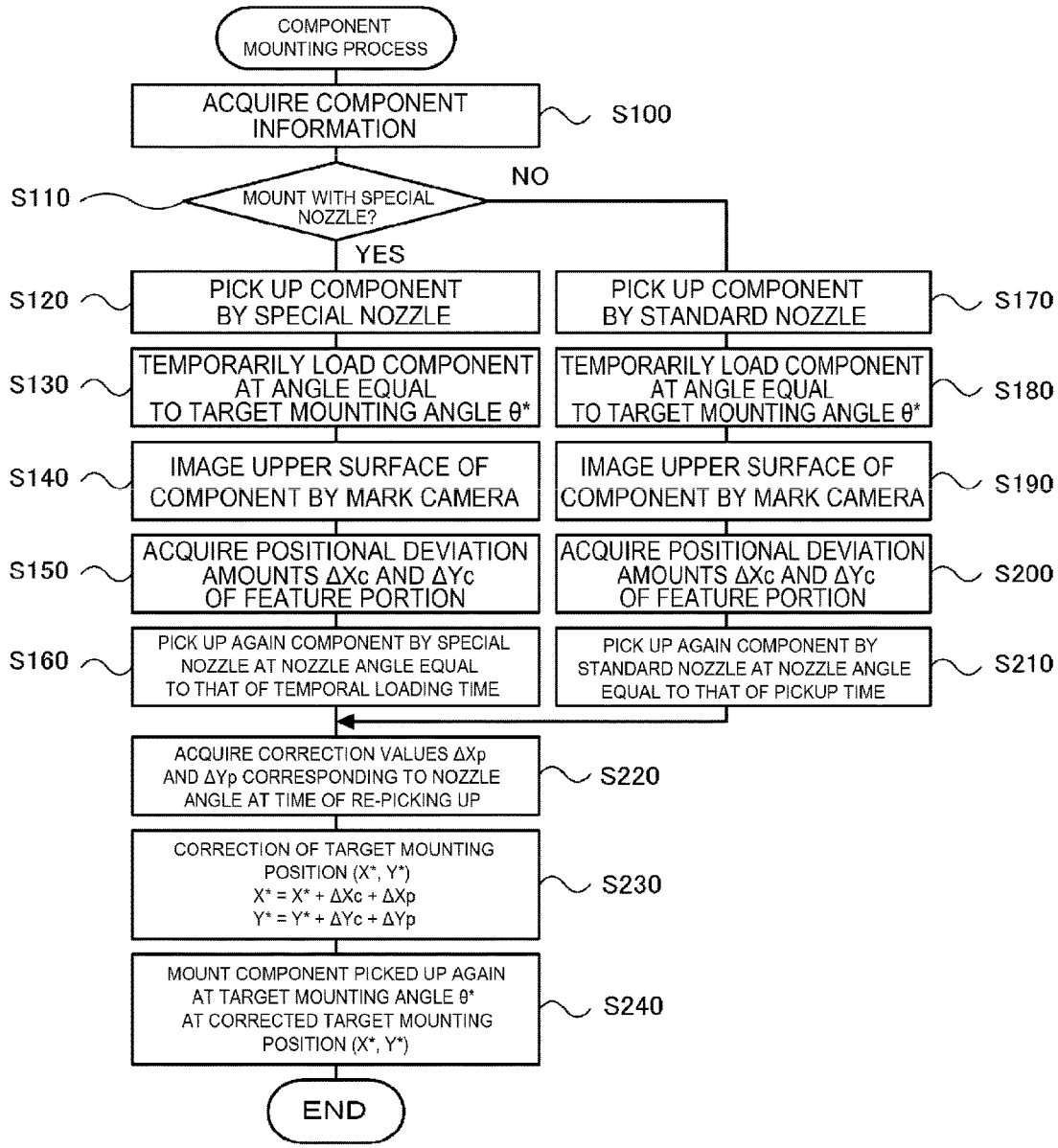
FIG. 6 is a flowchart illustrating an example of a component mounting process.

The following description is an explanation of an operation of component mounting system 10 configured in this way, in particular, a mounting operation when specific component 60 is mounted on board S. FIG. 6 is a flowchart illustrating an example of a specific component mounting process. This process is executed by control device 40 when board S is carried in by board conveyance unit 21 to be fixed with an instruction to an effect that specific component 60 is mounted on board S is made by job information from management PC 50.

In the component mounting process, CPU 41 of control device 40 first reads the component information included in the received job information (S100), determines whether specific component 60 of the mounting target is special component 60b required to be picked up and mounted with special nozzle 38b (S110).

Figures 7, 8:
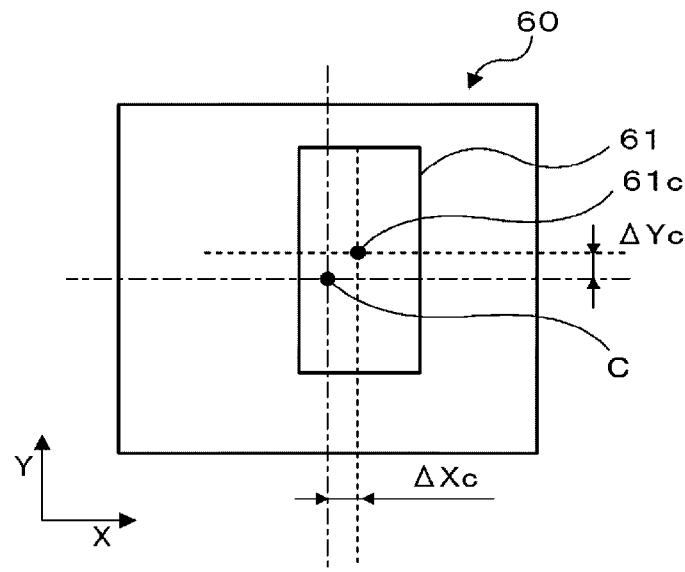
FIG. 7 is an explanatory view illustrating a state where positional deviation amounts $\Delta Xc$ and $\Delta Yc$ of feature portion 61 are acquired.
FIG. 8 is an explanatory view illustrating correction values.

CPU 41 controls head moving unit 23 and mounting head 30 (Z-axis motor 33, R-axis motor 34, and θ-axis motor 35) so that when it is determined that specific component 60 of the mounting target is special component 60b, specific component 60 (special component 60b) is picked up with special nozzle 38b (S120). In a case where suction nozzle 38 mounted on mounting head 30 is not special nozzle 38b but standard nozzle 38a, CPU 41 moves mounting head 30 to nozzle station 16, exchanges standard nozzle 38a mounted on mounting head 30 to special nozzle 38b, and then performs the pickup operation. Subsequently, CPU 41 controls head moving unit 23 and mounting head 30 (Z-axis motor 33, R-axis motor 34, and θ-axis motor 35) so that picked-up specific component 60 is temporarily loaded on loading stand 18 at an angle substantially equal to target mounting angle θ* to board S, included in the acquired component information (S130). Next, CPU 41 controls mark camera 36 so that an upper surface side of specific component 60 temporarily loaded on loading stand 18 is imaged (S140), processes the upper surface image which is imaged, and acquires positional deviation amounts ΔXc and ΔYc of the feature portion 51 in the XY direction, which is provided on the upper surface of specific component 60 (S150). FIG. 7 is an explanatory view illustrating a state where the positional deviation amounts of feature portion 61 are acquired. As illustrated in the drawing, acquisition of positional deviation amounts ΔXc and ΔYc of feature portion 61 is performed by acquiring differences between target temporary loading center C and center 61c of feature portion 51 in each of the X direction and the Y direction. Here, in specific component 60 having feature portion 61 on the upper surface, due to a manufacturing variation or the like, center 61c of feature portion 61 may be deviated with respect to an outer shape center of the component. Therefore, by acquiring the positional deviation amount between center 61c of feature portion 61 and target temporary loading center C, CPU 41 can reflect the positional deviation of feature portion 61 when specific component 60 is mounted on board S. CPU 41 controls head moving unit 23 and mounting head 30 (Z-axis motor 33, R-axis motor 34, and θ-axis motor 35) so that when positional deviation amounts ΔXc and ΔYc of feature portion 61 are acquired, specific component 60 on loading stand 18 is picked up again with special nozzle 60b at a nozzle angle substantially equal to that at the time of temporal loading (S160).

On the other hand, when it is determined that specific component 60 of the mounting target is standard component 60a rather than special component 60b in S110, CPU 41 controls head moving unit 23 and mounting head 30 (Z-axis motor 33, R-axis motor 34, and θ-axis motor 35) so that specific component 60 (standard component 60a) is picked up with standard nozzle 38a (S170). In a case where suction nozzle 38 mounted on mounting head 30 is not standard nozzle 38a but special nozzle 38b, CPU 41 moves mounting head 30 to nozzle station 16, exchanges special nozzle 38b mounted on mounting head 30 to standard nozzle 38a, and then performs the pickup operation. Subsequently, similarly to S130 to S150, CPU 41 temporarily loads picked-up specific component 60 on loading stand 18 at an angle substantially equal to target mounting angle θ* to board S, images the upper surface side of specific component 60 which is temporarily loaded, and processes the upper surface image to acquire positional deviation amounts ΔXc and ΔYc of the feature portion 51 in the XY direction (S180 to S200). Then, CPU 41 controls head moving unit 23 and mounting head 30 (Z-axis motor 33, R-axis motor 34, and θ-axis motor 35) so that specific component 60 on loading stand 18 is picked up again with standard nozzle 60b at a nozzle angle substantially equal to that when the component is picked up from component supply unit 12 (S210).

When specific component 60 is picked up again, CPU 41 acquires correction values ΔXp and ΔYp corresponding to the nozzle angle at the time of re-picking up (S220). FIG. 8 is an explanatory view illustrating an example of the correction value. Correction values ΔXp and ΔYp are provided for correcting (correcting target mounting position (X*, Y*)) the positional deviation in the XY direction when specific component 60 is mounted on board S and, as illustrated in the drawing, predetermined nozzle angles (for example, 0°, 90°, 180°, and 270°) for each suction nozzle attached to mounting head 30 are stored in HDD 43. Correction values ΔXp and ΔYp are obtained, for example, by picking up the component with the suction nozzle and mounting the component on a jig board for each predetermined nozzle angle, measuring the positional deviation amount of the outer shape center of the mounted component with respect to the target mounting center, and deriving an offset value for canceling the positional deviation based on the measured positional deviation amount. CPU 41 uses the value obtained by interpolating a correction value of an angle to be approximated when the nozzle angle at the time of re-picking up is an angle not stored in the correction value. The correction value is not limited to correct target mounting position (X*, Y*), and may be used to correct target mounting angle θ*.

Next, CPU 41 corrects target mounting position (X*, Y*) to board S, which is included in the acquired component information (S230). CPU 41 offsets target mounting position (X*, Y*) in a direction in which the positional deviation is canceled by positional deviation amounts ΔXc and ΔYc of the feature portion 51 acquired in S150 or S200 and corrects target mounting position (X*, Y*) to a position offset by correction values Xp and ΔYp acquired in S220. Then, CPU 41 controls head moving unit 23 and mounting head 30 so that specific component 60 is mounted on corrected target mounting position (X*, Y*) (S240), and ends the component mounting process.

FIGS. 9 and 10 are explanatory views for explaining the respective nozzle angles at the time of picking up, at the time of temporary loading, at the time of re-picking up, and at the time of mounting in the present embodiment and a comparative example. Incidentally, FIGS. 9 and 10 are examples of a case where specific component 60 supplied at an angle of 0° from component supply unit 12 is picked up and is mounted at an angle of 45° with respect to board S. As illustrated in FIG. 9, in a case where specific component 60 is mounted by using standard nozzle 38a, component mounting device 11 of the present embodiment picks up specific component 60 at the nozzle angle of 0°, and then temporarily loads specific component 60 on loading stand 18 at the nozzle angle of 45° that is equal to the angle at the time of mounting. Then, component mounting device 11 picks up again specific components 60 at the nozzle angle (relative angle to the component is 45°) of 0° that is equal to the angle at the time of picking up and mounts specific component 60 on board S at the nozzle angle as it is. That is, in component mounting device 11, the mounting operation in a case of mounting specific component 60 on board S by using standard nozzle 38a is performed so that the nozzle angle is not changed at the time of picking up and at the time of re-picking up, and the component angle is not changed at the time of temporary loading and at the time of mounting. On the other hand, in component mounting device 11 of the present embodiment, in a case where specific component 60 is mounted on board S by using special nozzle 38b, since a relative pickup angle to the component is determined in advance, specific component 60 is picked up at the predetermined nozzle angle of 0°, and then is temporarily loaded on loading stand 18 at the nozzle angle of 45° that is equal to the angle at the time of mounting. Then, component mounting device 11 picks up again specific component 60 at the nozzle angle (relative angle to the component is 0°) of 45° that is equal to the angle at the time of temporary loading, and mounts specific component 60 on board S at the nozzle angle as it is. That is, the mounting operation in a case where specific component 60 is mounted by using special nozzle 38b is performed so that the nozzle angle does not change at the time of temporary loading and at the time of re-picking up, and the component angle does not change at the time of temporary loading and at the time of mounting. In contrast, also in a case where the mounting operation is performed by using any of standard nozzle 38a and special nozzle 38b, the component mounting device of the comparative example picks up specific component 60 at the nozzle angle of 0°, and then temporarily loads specific component 60 on loading stand 18 at the nozzle angle as it is. Then, the component mounting device of the comparative example picks up again specific component 60 at the nozzle angle of 0° that is equal to the angle at the time of picking up, and mounts specific component 60 on board S at the nozzle angle of 45°. That is, the mounting operation of the component mounting device of the comparative example is performed so that the nozzle angle does not change at the time of picking up, at the time of temporary loading, and at the time of re-picking up.

Figure 11:
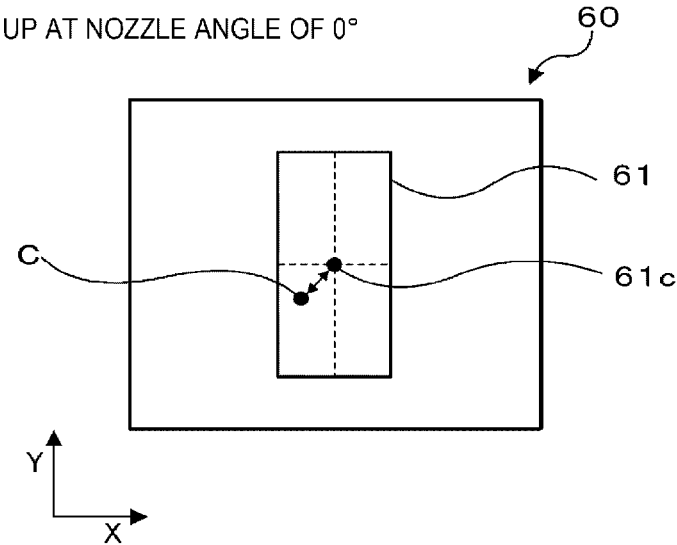
FIG. 11 is an explanatory view illustrating a change in a pickup deviation due to a nozzle angle.
Figure 11:
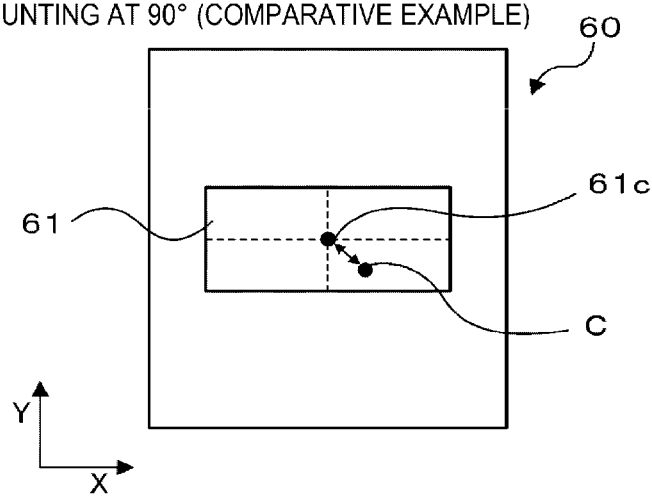
Figure 11:
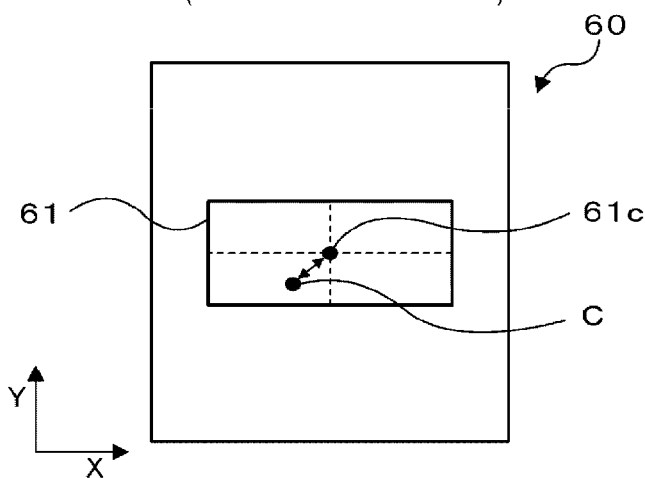

As described above, in a case where specific component 60 is mounted on board S, CPU 41 temporarily loads specific component 60 on loading stand 18, images the upper surface thereof by using mark camera 36, and acquires positional deviation amounts ΔXc and ΔYc of feature portion 61 based on the upper surface image to correct target mounting position (X*, Y*). When the component temporarily loaded on loading stand 18 is imaged by mark camera 36, if an inclination occurs in an optical axis of mark camera 36 with respect to loading stand 18, the component on the captured image may appear to be deviated with respect to the loading stand. Therefore, if the inclination of the optical axis of mark camera 36 occurs, CPU 41 may erroneously detect the positional deviation of feature portion 61. Further, when specific component 60 on loading stand 18 is picked up again, if the inclination occurs at a tip of suction nozzle 38 with respect to loading stand 18, a pickup deviation may occur in which suction nozzle 38 picks up specific component 60 at a position deviated from the original position. Such a pickup deviation based on erroneous detection of the positional deviation based on the inclination of the optical axis and the inclination of the nozzle is canceled to some extent by correction values ΔXp and ΔYp described above registered for each nozzle angle at the time of re-picking up, but a part thereof remains without being canceled. A part of the pickup deviation, which is not canceled, appears at a different position for each nozzle angle at the time of mounting if the nozzle angle is changed at the time of re-picking up and at the time of mounting. For example, when specific component 60 is picked up at the nozzle angle of 0°, and then temporarily loaded at the nozzle angle of 0°, and picked up again at the nozzle angle of 0° after recognizing the positional deviation of feature portion 61, and mounted at the nozzle angle of 90°, as illustrated in comparative examples of FIGS. 11 (a) to 11 (b), the pickup deviation at the time of re-picking up appears in a different range for each mounting angle of the component. On the other hand, when specific component 60 is picked up at the nozzle angle of 0°, and then temporarily loaded at the nozzle angle of 90° which is the same as the mounting angle, picked up again at the nozzle angle of 0° that is equal to the angle at the time of picking up after recognizing the positional deviation of feature portion 61, and the component picked up again is mounted at the nozzle angle of 0°, as illustrated in the embodiments of FIGS. 11 (a) to 11 (c), the pickup deviation at the time of re-picking up appears in the same range at any mounting angle.

Figure 12:
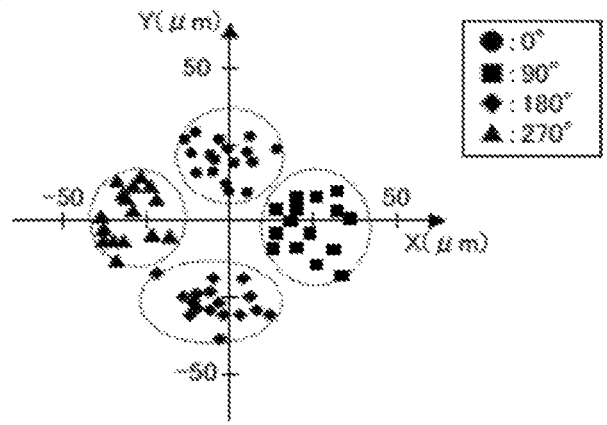
FIG. 12 is an explanatory view illustrating a tendency of a mounting deviation.
Figure 12:
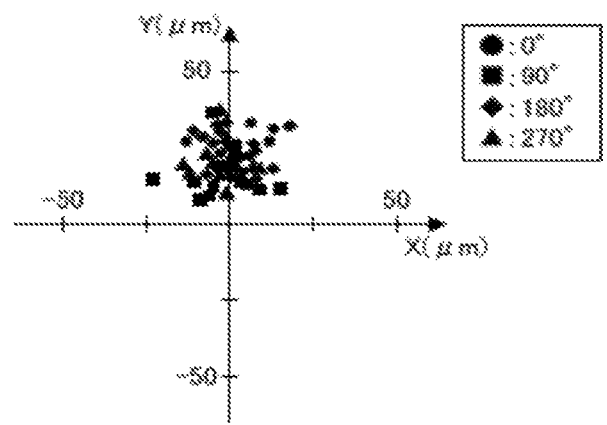

FIG. 12 is an explanatory view illustrating a tendency of the mounting deviation. FIG. 12(a) illustrates the tendency of the mounting deviation in a comparative example in which the nozzle angle is changed at the time of re-picking up and at the time of mounting. Further, FIG. 12(b) illustrates the tendency of the mounting deviation in the present embodiment in which the nozzle angle is not changed at the time of re-picking up and at the time of mounting. In the comparative example, the tendency of the mounting deviation for each nozzle angle at the time of mounting was greatly different from each other. In contrast, in the present embodiment, regardless of the nozzle angle at the time of mounting, the tendency of the mounting deviation was within a certain range. Thus, in the present embodiment, it is possible to suppress that the tendency of the mounting deviation for each nozzle angle is greatly different from each other, to converge the mounting deviation to a certain range.

Here, a correspondence relationship between the configuration elements of the present embodiment and the configuration elements of the present disclosure will be clarified. Mounting head 30 of the present embodiment corresponds to the head of the present disclosure, suction nozzle 38 corresponds to the pickup member, head moving unit 23 corresponds to the relative moving device, θ-axis motor 35 corresponds to the relative rotation device, loading stand 18 corresponds to the temporary loading stand, and mark camera 36 corresponds to the upper imaging device. Further, control device 40 for executing the component mounting process of FIG. 6 corresponds to the control device.

Component mounting device 11 of the present embodiment described above temporarily loads specific component 60 picked up with suction nozzle 38 on loading stand 18 at an angle substantially equal to target mounting angle θ* to board S. Next, the component mounting device images the upper surface of temporarily loaded specific component 60, and picks up again temporarily loaded specific component 60 with suction nozzle 38. Then, component mounting device 11 mounts specific component 60 which is picked up again at target mounting angle θ* to target mounting position (X*, Y*) corrected based on the positional deviation amount of feature portion 61 which is recognized by the upper surface image of the upper surface which is imaged. Thus, since it is possible to mount specific component 60 on board S at an angle substantially equal to that when specific component 60 is temporarily loaded on the loading stand 18, even if the inclination occurs in suction nozzle 28, mark camera 36, and loading stand 18, it is possible to suppress the variation in mounting accuracy.

Further, component mounting device 11 of the present embodiment described above performs control so that the nozzle angle at the time of picking up specific component 60 supplied from component supply unit 12 and the nozzle angle at the time of re-picking up of specific component 60 which is temporarily loaded on loading stand 18 are substantially equal to each other. By doing so, even when the tip of suction nozzle 38 is inclined with respect to loading stand 18, the pickup deviation at the time of re-picking up of specific component 60 from loading stand 18 can be within a certain range.

Further, in a case where the mounting operation is performed by using special nozzle 38b of which the nozzle angle at the time of picking up of specific component 60 (special component 60b) is determined in advance, component mounting device 11 of the present embodiment described above performs control so that the nozzle angle at the time of temporarily loading of specific component 60 on loading stand 18 and the nozzle angle at the time of re-picking up of specific component 60 from loading stand 18 are substantially equal to each other. Thus, even when the mounting operation is performed by using special nozzle 38b, it is possible to prevent the nozzle angle from being changed at the time of re-picking up and at the time of mounting, and it is possible to suppress the variation in mounting accuracy. However, in a case where special nozzle 38b is used, since the nozzle angle at the time of picking up of specific component 60 supplied from component supply unit 12 and the nozzle angle at the time of re-picking up of specific component 60 temporarily loaded on loading stand 18 do not match, component mounting device 11 cannot correct the positional deviation based on the inclination of the nozzle.

Further, component mounting device 11 of the embodiment described above acquires correction values ΔXp and ΔYp corresponding to the nozzle angle at the time of re-picking up of specific component 60 on loading stand 18, and mounts specific component 60, which is picked up again, on target mounting position (X*, Y*) corrected based on correction values ΔXp and ΔYp. Therefore, it is possible to improve the mounting accuracy of specific component 60.

It is needless to say that the present disclosure is not limited to the embodiments described above, and may be implemented in various aspects as long as they belong to the technical scope of the present disclosure.

For example, in the embodiments described above, in a case where specific component 60 (standard component 60a) is picked up with standard nozzle 38a of which the nozzle angle at the time of picking up is not determined, temporarily loaded on loading stand 18, and picked up again to be mounted on board S after recognizing the positional deviation of feature portion 61, component mounting device 11 is configured to make the nozzle angle at the time of re-picking up substantially equal to the nozzle angle at the time of picking up. However, the present disclosure is not limited thereto. Even in a case where specific component 60 is mounted with standard nozzle 38a, component mounting device 11 may pick up again specific component 60 from loading stand 18 at an angle different from the nozzle angle at the time of picking up.

In addition, in the embodiments described above, correction values ΔXp and ΔYp of specific component 60 are stored for each nozzle angle for each suction nozzle 38. However, the present disclosure is not limited thereto, and one correction value may be stored for each suction nozzle 38 (for each nozzle position) regardless of the nozzle angle, or one correction value may be stored for each nozzle angle regardless of suction nozzle 38 (nozzle position). Further, one correction value may be stored for each component of specific component 60, or a common correction value may be stored for multiple specific components.

Figure 13:
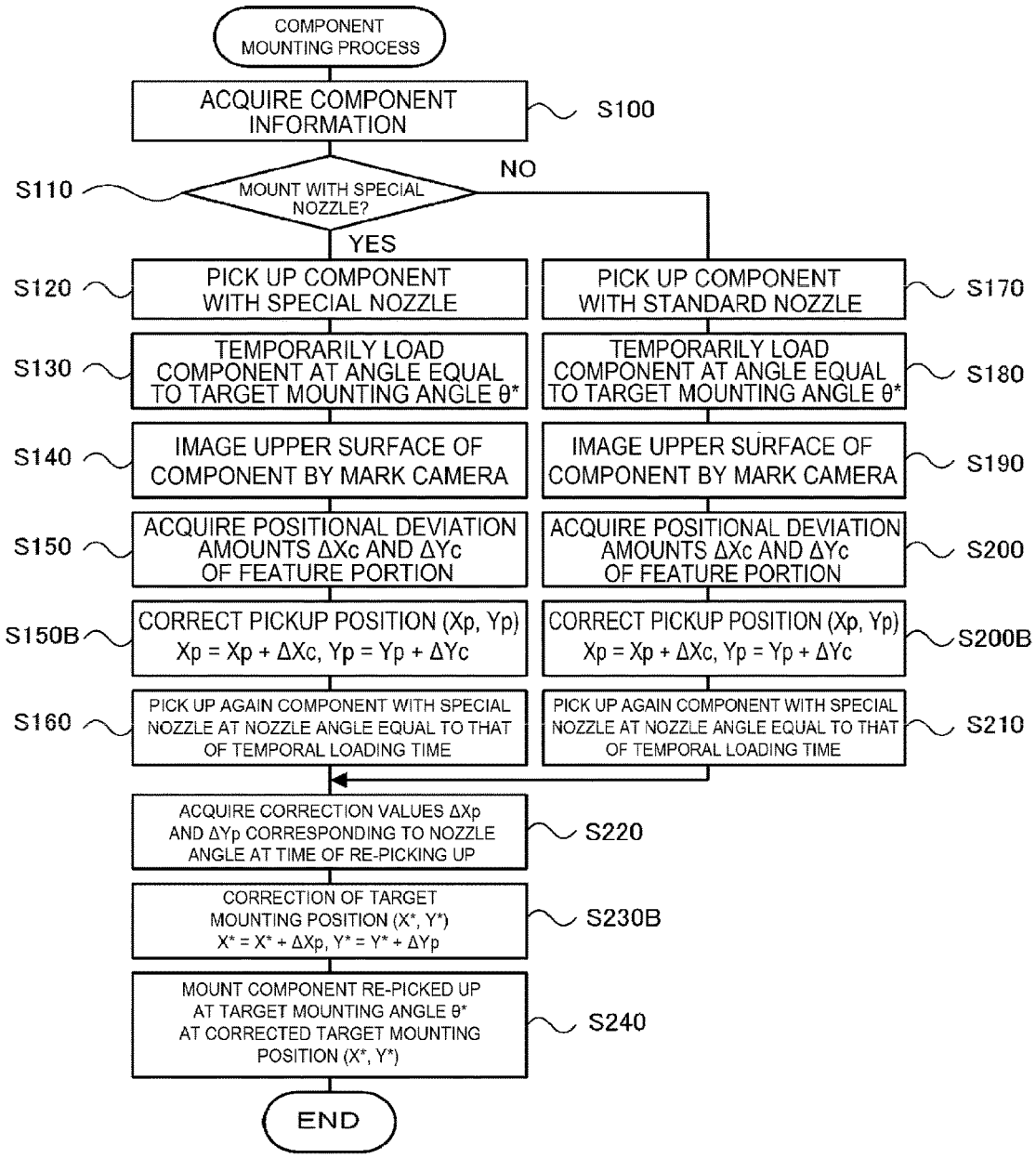
FIG. 13 is a flowchart illustrating a component mounting process of a modification example.

Furthermore, in the embodiments described above, CPU 41 corrects target mounting position (X*, Y*) to board S in a direction in which the positional deviation is canceled based on positional deviation amounts ΔXc and ΔYc of feature portion 61 which is recognized by imaging the upper surface of specific component 60 temporarily mounted on loading stand 18. However, as illustrated in S150B and S200B of the component mounting process of FIG. 13, CPU 41 may offset (correct) pickup position (Xp, Yp) in a direction in which the positional deviation is canceled based on positional deviation amounts ΔXc and ΔYc of feature portion 61, and pick up again specific component 60 on loading stand 18. In this case, as illustrated in S230B, the correction of target mounting position (X*, Y*) is performed by being offset in a direction in which the positional deviation is canceled by correction values ΔXp and ΔYp is canceled.

INDUSTRIAL APPLICABILITY

The present disclosure can be applied to a manufacturing industry of a component mounting device.

REFERENCE SIGNS LIST

10 component mounting system, 11 component mounting device, 12 component supply unit, 13 feeder, 14 tray unit, 15 part camera, 16 nozzle station, 18 loading stand, 21 board conveyance unit, 22 mounting unit, 23 head moving unit, 30 mounting head, 31 rotation body, 32 nozzle holder, 33 Z-axis motor, 34 R-axis motor, 35 θ-axis motor, 36 mark camera, 38 suction nozzle, 38a standard nozzle, 38b special nozzle, 40 control device, 41 CPU, 42 ROM, 43 HDD, 44 RAM, 45 input/output interface, 46 bus, 50 management computer (management PC), 52 input device, 54 display, 60 specific component, 60a standard component, 60b special component, 61 feature portion, 61c center, 62 abutting surface, S board, T tape.

The invention claimed is:

1. A component mounting device configured to mount a component, which has a feature portion on an upper surface, on a board, the component mounting device comprising:
   a head having a pickup member which picks up the component;
   a relative moving device configured to relatively move the head;
   a relative rotation device configured to relatively rotate the pickup member;
   a temporary loading stand on which the component is capable of being loaded;
   an upper imaging device imaging the component from above; and
   a control device configured to control the head, the relative moving device, and the relative rotation device in such a way that the pickup member picks up a component supplied from a component supplying device,
   control the head, the relative moving device, and the relative rotation device in such a way that the picked-up component is loaded on the temporary loading stand at an angle substantially equal to a target mounting angle to the board,
   control the upper imaging device in such a way that an upper surface of the loaded component is imaged,
   control the head, the relative moving device, and the relative rotation device in such a way that the pickup member picks up again the loaded component, and
   control the head, the relative moving device, and the relative rotation device in such a way that the component picked up again is mounted, at the target mounting angle to the board, at a target mounting position corrected based on a position deviation amount of the feature portion recognized by an upper surface image of the imaged upper surface.

2. The component mounting device according to claim 1, wherein the control device performs control in such a way that a rotation angle of the pickup member when the component supplied from the component supplying device is picked up and a rotation angle of the pickup member when the component loaded on the temporary loading stand is picked up again are substantially equal to each other.

3. The component mounting device according to claim 2, wherein a specific pickup member of which a rotation angle when picking up a specific component is determined to be a specific rotation angle and a non-specific pickup member of which a rotation angle when picking up a non-specific component is not determined are capable of being attached to the head, and
   wherein the control device performs control in such a way that when the non-specific component is mounted on the board by using the non-specific pickup member, a rotation angle of the pickup member when the non-specific component supplied from the component supplying device is picked up and a rotation angle of the pickup member when the non-specific component loaded on the temporary loading stand is picked up again are substantially equal to each other, and
   performs control in such a way that when the specific component is mounted on the board by using the specific pickup member, a rotation angle of the pickup member when the specific component supplied from the component supplying device is picked up is the specific rotation angle, and a rotation angle of the pickup member when the specific component loaded on the temporary loading stand is picked up again is substantially equal to a rotation angle of the pickup member when the specific component is loaded on the temporary loading stand.

4. The component mounting device according to claim 2, comprising:
   a storage device configured to store a correction value for correcting the target mounting position for each rotation angle of the pickup member,
   wherein the control device acquires a correction value corresponding to a rotation angle of the pickup member when the component is picked up again from the storage device, and
   performs control in such a way that the component picked up again is mounted at the target mounting angle at the target mounting position corrected based on the acquired correction value and the positional deviation amount of the feature portion.

5. A component mounting device configured to mount a component, which has a feature portion on an upper surface, on a board, the component mounting device comprising:
   a head having a pickup member which picks up the component;
   a relative moving device configured to relatively move the head;
   a relative rotation device configured to relatively rotate the pickup member;
   a temporary loading stand on which the component is capable of being loaded;
   an upper imaging device imaging the component from above; and
   a control device configured to control the head, the relative moving device, and the relative rotation device in such a way that the pickup member picks up a component supplied from a component supplying device,
   control the head, the relative moving device, and the relative rotation device in such a way that the picked-up component is loaded on the temporary loading stand at an angle substantially equal to a target mounting angle to the board,
   control the upper imaging device in such a way that an upper surface of the loaded component is imaged,
   control the head, the relative moving device, and the relative rotation device in such a way that a pickup position is determined based on a positional deviation amount of the feature portion recognized by an upper surface image of the imaged upper surface and the pickup member picks up again the component loaded on the temporary loading stand, and control the head, the relative moving device, and the relative rotation device in such a way that the component picked up again is mounted, at the target mounting angle to the board, at a target mounting position.

\* \* \* \* \*